United States Patent [19]

Fobbester et al.

[11] Patent Number: 5,239,455
[45] Date of Patent: Aug. 24, 1993

[54] CHARGE PUMP CIRCUIT

[75] Inventors: Ian G. Fobbester, Gloucestershire; Peter Good, Wiltshire, both of England

[73] Assignee: Plessey Semiconductors Limited, England

[21] Appl. No.: 777,804

[22] Filed: Oct. 17, 1991

[30] Foreign Application Priority Data

Oct. 31, 1990 [GB] United Kingdom ............... 9023671

[51] Int. Cl.⁵ .......................... H02M 7/25; H03L 7/00
[52] U.S. Cl. ...................................... 363/60; 307/510; 307/511; 328/155; 323/315
[58] Field of Search .................... 363/60; 331/1 A, 8, 331/17, 25, 111, 113 R; 328/133, 134, 155; 307/510, 511, 514, 516; 323/315

[56] References Cited

U.S. PATENT DOCUMENTS 4,636,748 1/1987 Latham, II ................ 331/17
4,959,618 9/1990 Shier ........................ 328/155

Primary Examiner—Emanuel T. Voeltz
Attorney, Agent, or Firm—Kirschstein, Ottinger, Israel & Schiffmiller

[57] ABSTRACT

A charge pump circuit for a frequency/phase comparator in a phase locked loop oscillator arrangement, in which current sources utilizing only npn transistors provide currents of equal magnitude but of opposite sense to an input of an operational amplifier, the output of this amplifier charge-pumping a capacitor to control the frequency of oscillation of an oscillator. The use of npn transistors enables higher current levels and higher speed switching compared to circuits including pnp transistors.

6 Claims, 3 Drawing Sheets

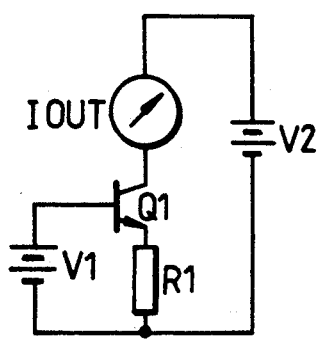
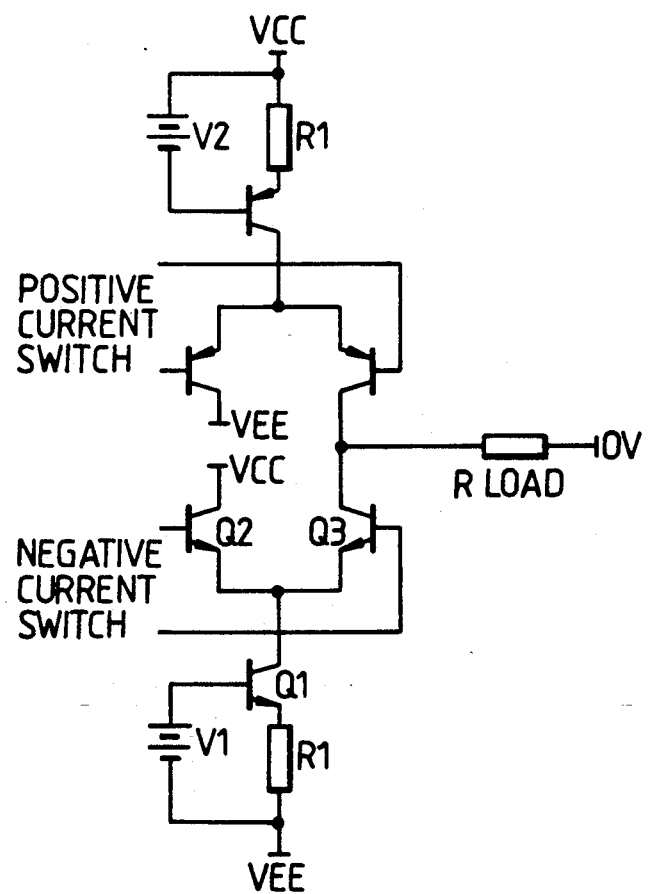

CHARGE PUMP CIRCUIT

FIELD OF INVENTION

The present invention relates to a charge pump circuit for a frequency/phase comparator used in a phase locked loop.

BACKGROUND ART

A current source can be easily made using a conventional bipolar transistor as shown in FIG. 1 where the base voltage is fixed by a voltage source $V_1$. The output current over the operating voltage range of the transistor is fairly constant and can be calculated from:

$$I\text{ out} = \frac{V_1 - V_{be}}{R_1}$$

The current source may be switched by inserting a differential transistor pair in series with the output current as shown in FIG. 2. Depending on the polarity of the switching signal input, the current from Q1 can be diverted through either Q2 or Q3. A current of opposite polarity can be produced by substituting PNP transistors for the NPN types shown in FIGS. 1 and 2. By using both types connected as in FIG. 3, a bi-directional current can be fed to the load according to the state of the input switch signals.

A problem exists when using this arrangement on an integrated circuit process because PNP transistors may not be available or are very often limited in gain and frequency response preventing very rapid switching of the current.

A circuit similar to that in FIG. 3 is often used as a charge pump circuit in known phase locked loop frequency synthesisers where up and down signals from the phase detector drive the appropriate +ve or −ve switch inputs to provide a correction signal to the voltage controlled oscillator to maintain phase lock. The system is shown in FIG. 4.

In operation the phase detector provides a continuous stream of pulses of the appropriate polarity to maintain the divided VCO signal in phase with the reference input to the phase detector. The pulses applied to OP AMP vary in width and polarity according to the phase error but are always of constant amplitude. This circuit is generally known as a charge pump circuit.

SUMMARY OF THE INVENTION

It is an object of the present invention to provide a charge pump circuit for a frequency/phase comparator circuit wherein the use of pnp transistors is avoided.

The present invention provides a charge pump circuit comprising an operational amplifier having a first input, a second input, an output, and a feedback loop including reactance means coupled between the output and second input, a first current source providing a first current to a first resistance which is coupled to said first input, a second current source providing a second current equal to said first current, first npn transistor switch means for selectively switching said second current to said second input, a second resistance equal in value to said first resistance coupled to said second input and second npn transistor means for selectively switching a third current equal and opposite to said first current via said second resistance to said second input, whereby said reactance means is charge pumped by said second and third currents.

An important feature of the invention is that said second and third currents are made equal to the first current, said third current being made equal by choosing a second resistance equal in value to the first resistance. Since the first and second resistances are coupled to inputs of an operational amplifier and are thus effectively coupled to a virtual earth node, it is ensured that the current flows are equal.

Whilst said second current could be provided by a similar resistance arrangement, it is preferred to provide the second current by a current source coupled to the first current source by means of a current mirror technique.

PREFERRED EMBODIMENT OF THE PRESENT INVENTION

A preferred embodiment of the invention will now be described with reference to the accompanying drawings, wherein:

FIGS. 1 to 4 are diagrams of prior art arrangements for current switching, FIG. 4 being a diagram of a phase locked loop using a charge pump having a current switching arrangement;

Thus in accordance with the invention, a bi-directional current source has been designed which uses only npn transistors and can therefore be fabricated on IC processes without pnp transistors.

DISCLOSURE OF THE PREFERRED EMBODIMENT

Figure 4:
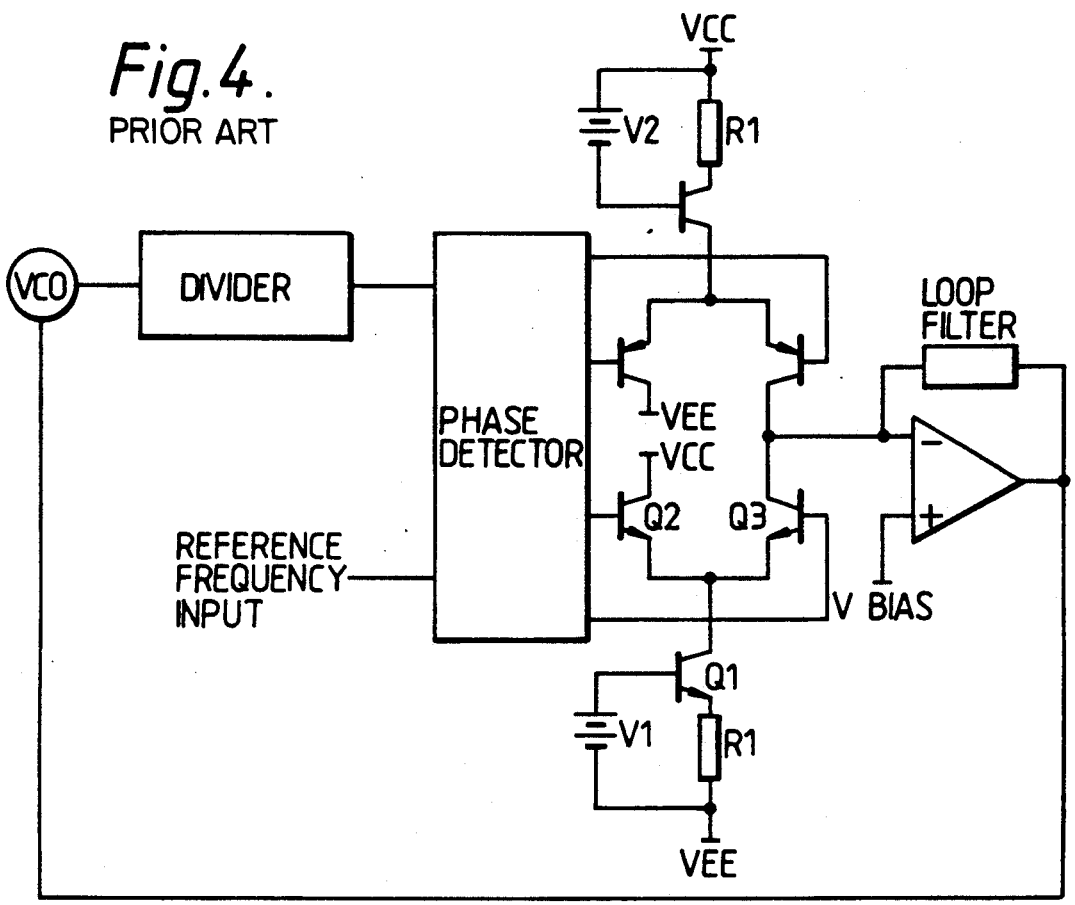
Figure 5:
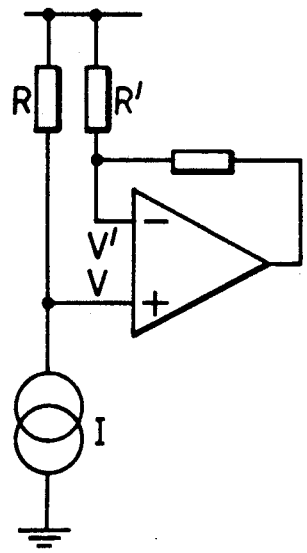
FIG. 5 is a circuit diagram illustrating a feature of the present invention.

Referring now to FIGS. 4 to 7 of the drawings, a feature of the circuit shown in FIG. 4 is that the inverting input of the operational amplifier will be maintained at a voltage equal to the bias voltage on the non inverting input by virtual earth principles. Using this fact, the current in R' in FIG. 5 will equal that in R, set by the current source I since V' must always equal V and provided R=R'.

Figure 6:
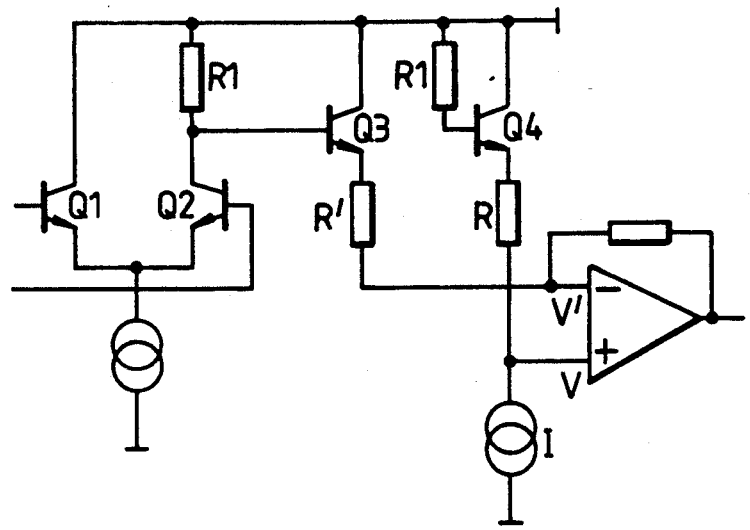
FIG. 6 is a circuit diagram of the circuit of FIG. 5 incorporated in a current switching arrangement.

Extending this argument, the circuit shown in FIG. 6 will generate a current in R' equal to I provided R'=R and that Q3 and Q4 are matched. A switching signal applied to the bases of Q1, Q2 will allow a pulsed current to be produced in Q3.

Figure 7:
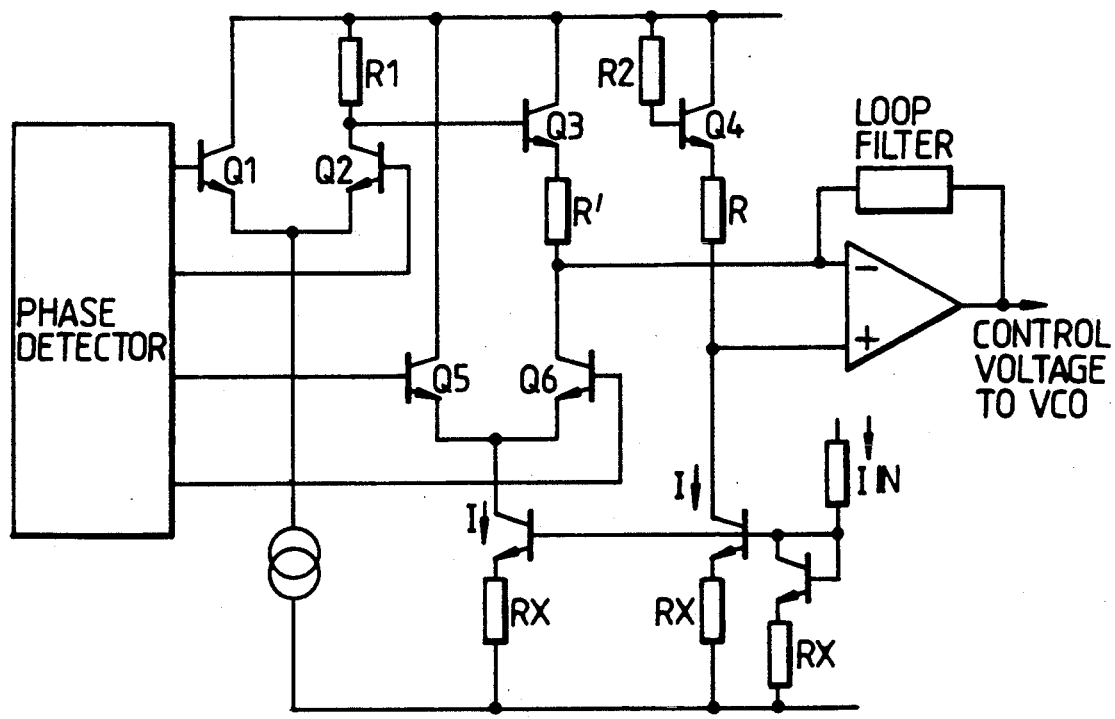
FIG. 7 is a circuit diagram of the preferred embodiment with the circuit of FIG. 6 incorporated in a phase comparator of a phase locked loop.

A full circuit diagram of a bi-directional charge pump using this technique is shown in FIG. 7. This circuit is equivalent to the complementary version described in FIG. 4.

The current IIN produces two equal currents I using conventional current mirror techniques and Q5 Q6 are switched by the phase detector producing a current sink pulse to the OP AMP and loop filter. Q1, Q2 are switched by the phase detector producing a current source output of equal magnitude to the current sink provided R1=R2. R'=R and Q3 and Q4 are matched.

The advantages of this circuit are:

1. A charge pump circuit with symmetrical positive and negative current outputs can be produced on an integrated circuit process without pnp transistors.
2. A charge pump circuit can be produced with relatively high current levels, reducing the effects of noise in the operational amplifier. The poor characteristics of pnp transistors on many integrated circuit processes prevent their use at current levels greater than a few hundred microamperes.
3. A charge pump circuit with high switching speed can be produced. This is difficult on many integrated circuit processes because the frequency capability of pnp transistors is very poor compared with npn types.

We claim:

1. A charge pump circuit comprising:
an operational amplifier having a first input terminal, a second input terminal, an output terminal and a feedback loop including reactance means coupled between said output terminal and said second input terminal,
a first current source for providing a first current to a first resistance which is coupled to said first input terminal,
a second current source for providing a second current equal to said first current,
first npn transistor switching means for selectively switching said second current to said second input terminal,
a second resistance equal in value to said first resistance coupled to said second input terminal,
a third current source for providing a third current equal and opposite to said second current, and
second npn transistor switching means for selectively switching said third current via said second resistance to said second input terminal, whereby said reactance means is charge pumped by said second and third currents.

2. A circuit as claimed in claim 1 wherein said second current source is coupled to said first current source in a current mirror arrangement.

3. A circuit as claimed in claim 1 wherein said operational amplifier and feedback loop form a low pass filter.

4. A circuit as claimed in claim 1 wherein said first npn transistor switching means comprises a differential pair of transistors with the first current source connected to the emitters of the pair, and the collector of one transistor being coupled to the second input terminal.

5. A circuit as claimed in claim 1 wherein said second npn transistor switching means comprises a differential pair of transistors with the collector of one of the pair being coupled to control the base of a third npn transistor having said second resistance located in the main current path thereof.

6. A circuit as claimed in claim 5 including a fourth npn transistor matched to said third npn transistor and having said first resistance located in the main current path thereof.

* * * * *